United States Patent [19]
Nielsen

[11] 4,370,574
[45] Jan. 25, 1983

[54] DETECTOR FOR TIME DIFFERENCE BETWEEN TRANSITIONS IN TWO WAVE FORMS

[75] Inventor: Raymond E. Nielsen, Phoenix, Ariz.

[73] Assignee: Honeywell Information Systems Inc., Phoenix, Ariz.

[21] Appl. No.: 211,162

[22] Filed: Nov. 28, 1980

[51] Int. Cl.[3] .............................................. H03K 5/26
[52] U.S. Cl. .................................... 307/514; 307/236; 307/518; 307/291
[58] Field of Search ............... 307/291, 514, 516, 518, 307/236

[56] References Cited

U.S. PATENT DOCUMENTS

| | | | |
|---|---|---|---|
| 3,178,584 | 4/1965 | Clark | 307/291 |
| 3,304,496 | 2/1967 | Lorenz | 307/514 |
| 4,001,603 | 1/1977 | Wilcox | 307/516 |
| 4,112,296 | 9/1978 | Heimbigner et al. | 307/291 |

*Primary Examiner*—John S. Heyman
*Attorney, Agent, or Firm*—L. D. Burton; W. W. Holloway, Jr.; L. J. Marhoefer

[57] ABSTRACT

A slowly varying bias signal is added to one input of a Wave Form Transition Sequence Detector, as more fully described in a related application cited herein, to provide a differential output therefrom which is directly proportional to the time between transitions occurring on two input wave forms. The slowly varying bias modulates the level of one input wave form, and thereby varies the time required for the Wave Form Transition Detector to detect a transition occuring thereon. By symmetrically varying the response time of the Wave Form Transition Sequence Detector to one input wave form in the neighborhood of the occurrence of a transition on the second input waveform, the average differential output of the Wave Form Transition Sequence Detector over a cycle of the slowly varying bias level will be proportional to the time between transitions occurring on the two input wave forms.

4 Claims, 11 Drawing Figures

DETECTOR FOR TIME DIFFERENCE BETWEEN TRANSITIONS IN TWO WAVE FORMS

CROSS-REFERENCE TO RELATED APPLICATION

Application Ser. No. 06/210950, filed Nov. 28, 1980, entitled WAVE FORM TRANSITION SEQUENCE DETECTOR by Bruce C. Keene and assigned to the assignee of the present invention.

BACKGROUND OF INVENTION

1. Field of Invention

The present invention relates to the field of digital systems and is more particularly concerned with the detection of the time difference between transitions in two wave forms.

2. Description of Prior Art

In dealing with digital systems, it is often desirable to investigate wave form transitions from a first level to a second level. Areas of interest in considering transitions occurring on two separate wave forms are: which of two wave forms undergoes a transition first; time between transitions on two separate wave forms; and coincidence, in time, of transitions.

Such investigations in the past have been approached in various ways. One of the most common ways to investigate wave form transitions is with the use of the oscilloscope. This normally requires either a dual trace oscilloscope with an accurate time base, or a single trace oscilloscope with the ability to trigger the sweep from one of the wave forms under study. However, in dealing with very short time intervals, a very wide band or sampling oscilloscope is required. Such instruments are complex and consequently rather expensive.

Another approach to investigating the relative time between transitions on two separate wave forms is to use an event counter, a clock source, and gating means controlled by the wave forms under investigation. However, as the intervals of time between wave form transitions approach the sub-nanosecond range, high-speed, complex and expensive equipment is again required.

SUMMARY OF INVENTION

The present invention is concerned with the detection of transitions in wave forms, and more particularly with a method of determining the amount of time between transitions occurring on two separate wave forms. In the limiting case where this time interval approaches zero, the present invention can likewise indicate approximate coincidence.

The present invention is related to the U.S. patent application of Bruce C. Keene, Ser. No. 06/210,950, dealing with the detection of the first transition occurring between two wave forms, and further extends said application by providing an indication of the amount of time by which the transitions in one wave form leads or lags the transition in the second wave form.

The present invention is based upon several principles. First, in the Description of Illustrated Embodiment in the Keene application a circuit is disclosed which changes from a first state in which flip-flop action is inhibited to a second state wherein flip-flop action occurs, and in so changing defines which of two input wave forms underwent a transition from a high to low state first. The change of mode of operation from a first mode wherein flip-flop action is inhibited to a second mode where flip-flop action is not inhibited, occurs at a defined level, which, hereinafter, will be referred to as the Keene Circuit Switch Level.

The second principle involved herein is based on the fact that a wave form undergoing transition from a first level to a second level requires a finite amount of time to do so. Consequently, when an input wave form to the Keene circuit is in the process of changing from a high to a low state, the Keene circuit detects the change when the input wave form falls below the said Keene Circuit Switch Level. The present invention is directed to varying the amount of time required for the input wave form to reach this defined level by varying the point from which the transition begins. By so doing, the amount of time required to reach the Keene Circuit Switch Level likewise varies. By so varying the time required by the input wave form to reach this defined level, the average differential output of the Keene circuit varies in direct proportion to the difference of time between the two wave form transitions.

A primary object of the present invention is to detect the time difference between transitions of two wave forms.

A further object of the present invention is to detect the time difference between transitions of two wave forms in a simple way.

A still further object of the present invention is to detect the time difference between transitions of two wave forms in a simple and inexpensive way.

A yet further object of the present invention is to detect the time difference between transitions of two wave forms in a simple and inexpensive way with a resolution in the sub-nanosecond range.

The foregoing and other objects, features and advantages of the invention will be apparent from the following more particular description of an illustrated embodiment of the invention, as illustrated in the accompanying drawings.

DESCRIPTION OF ILLUSTRATED EMBODIMENT

Figure 1:
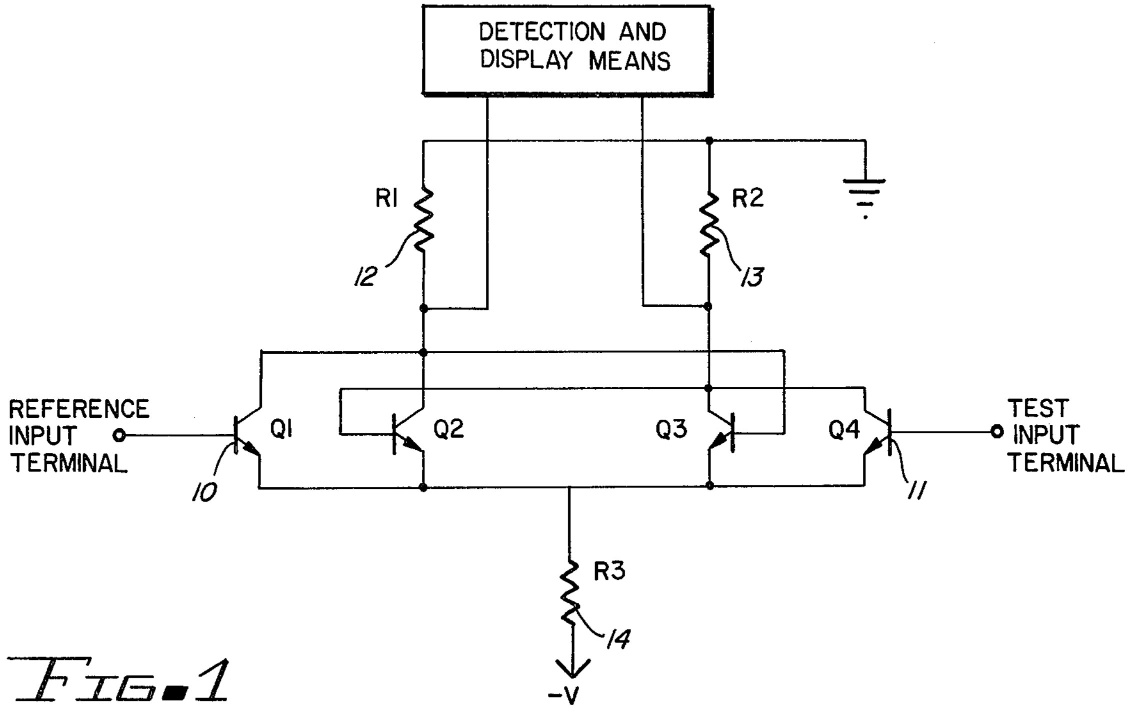
FIG. 1 is an illustrated embodiment of the Keene application.

FIG. 1 is a diagram of an illustrated embodiment of the Keene application. For a detailed description, please refer to the referenced application.

Assuming that both the Reference Input Signal and the Test Input Signal are in the high state, both transistors Q1 10 and Q4 11 will be in the ON or conducting state. Consequently, a finite amount of current will be flowing through each of the collector resistors R1 12 and R2 13, and likewise a finite amount of current will be flowing through the common emitter resistor R3 14. Hence the minimum potential that must be maintained by the Reference Input Signal or Test Input Signal to hold the corresponding transistor Q1 10 or Q4 11 in the conducting state is the forward voltage drop of the base to emitter junction of transistors Q1 or Q4, when said base emitter junction of transistor Q1 10 to transistor Q4 11 is forward biased, plus the voltage appearing at the common emitter of transistors Q1 through Q4, in addition to the supply potential. When the potential of either the Reference Input Signal or the Test Input Signal falls below this defined level, the corresponding transistor will cease to conduct and consequently switch to its OFF or nonconducting state. Hence the existence of the Keene Circuit Switch Level is observed.

Figure 2:
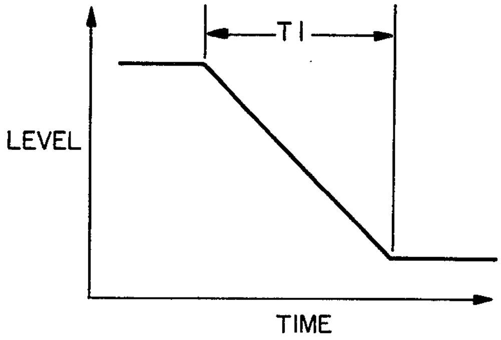
FIG. 2 is a diagram illustrating a wave form undergoing a transition from a high to a low state.

FIG. 2 is a drawing illustrating a wave form undergoing a transition from a high state to a low state. It is observed that a finite amount of time, T1, albeit small, is required for a wave form to change from a first state to a second state.

Figure 3:
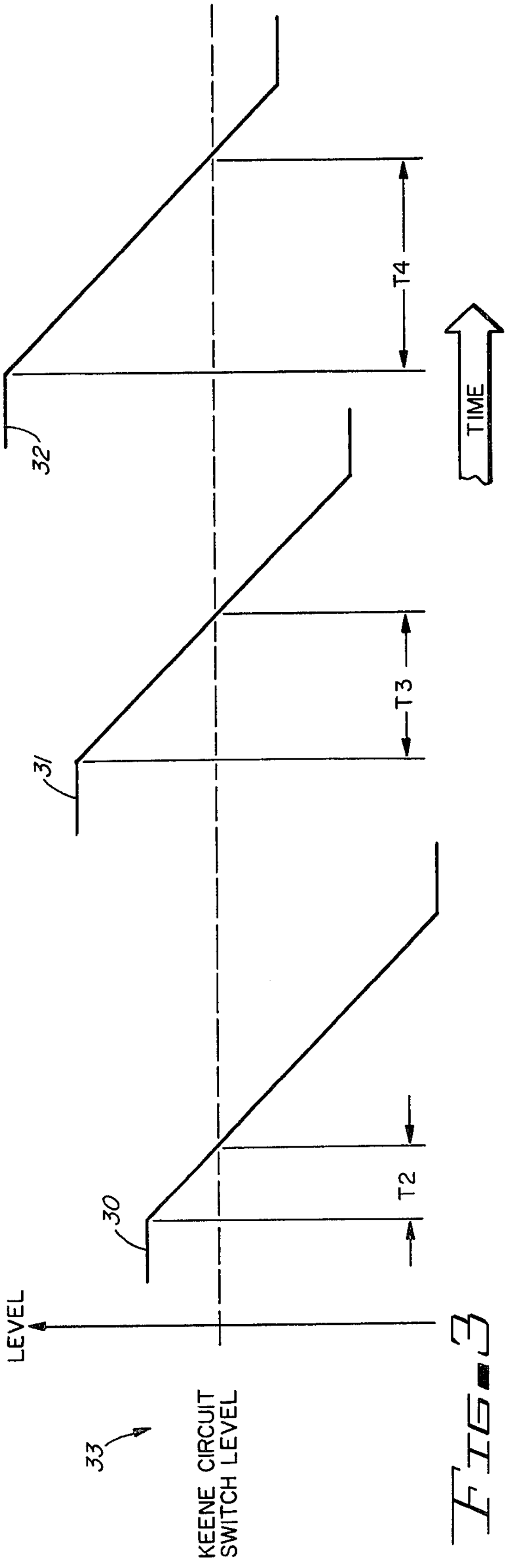
FIG. 3 is a diagram illustrating a wave form undergoing a transition from a high to a low state with three different bias levels applied thereto. This figure also indicates the corresponding Keene Circuit Switch Level.

FIG. 3 is a drawing illustrating three different wave forms 30, 31, and 32 undergoing a transition from a high to low state relative to the Keene Circuit Switch Level 33. It is observed that each of said wave forms 30, 31, and 32 has a different high state level relative to the Keene Circuit Switch Level 33. It is also observed that the greater the potential difference between the high state level and the Keene Circuit Switch Level, the correspondingly longer the amount of time T2, T3, and T4 required for the wave forms 30, 31, and 32 to reach the Keene Circuit Switch Level 33. Consequently, varying the level of the wave form undergoing transition will correspondingly vary the amount of time required for the wave form to reach the Keene Circuit Switch Level 33.

Figure 4:
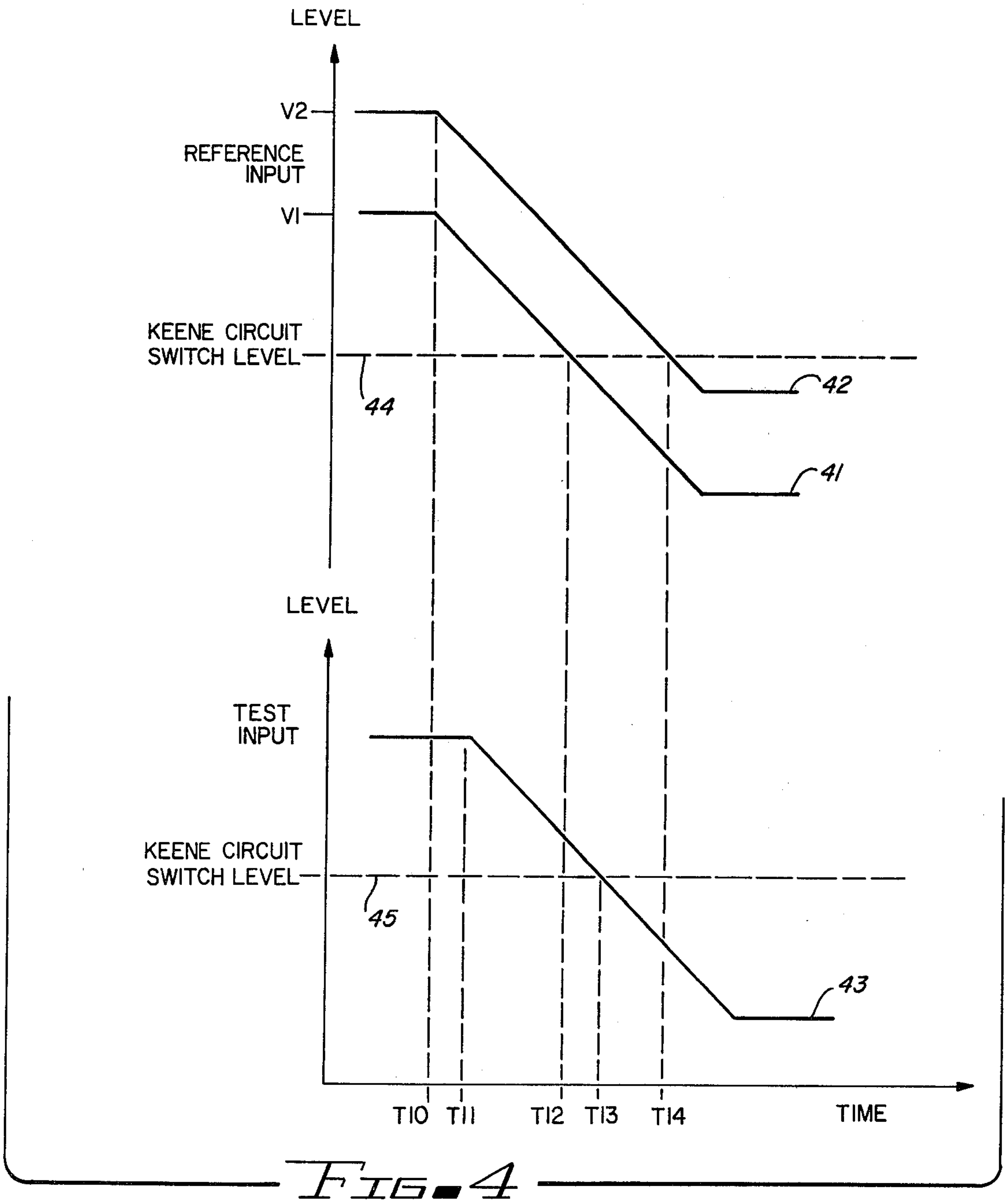
FIG. 4 illustrates the effect of a bias level applied to the Reference Input Signal of the Keene circuit in a noncoincident situation.

FIG. 4 illustrates the case in which a positive level (equal to V2 minus V1) is added to the Reference Input Signal 41 to shift it upward in level 42. It is observed, in the case illustrated, that the Reference Input Signal 41 or 42, beginning to change state at time T10, leads the Test Input Signal 43, which does not begin to change state until time T11. The Keene Circuit Switch level is shown as levels 44 and 45. For the Reference Input Signal 41 with a high state level of V1, the Keene circuit responds to a change of state from the high level to the low level when the Reference Input Signal wave form 41 intersects the switch level 44 at time T12. The Test Input Signal 43 does not reach the corresponding switch level 45 until time T13. Consequently, the Keene circuit responds to the change of level for the Reference Input Signal 41 first (T12 occurs before T13).

However, when the Reference Input Signal 41 is shifted upward in level to the point where its high state is at level V2, it is observed that, although the Reference Input Signal still begins the high to low transition at time T10 prior to the Test Input Signal beginning its high to low transition at time T11, the Test Input Signal wave form 43 reaches the switch level 45 at time T13 before the Reference Input Signal 42 reaches the corresponding switch level 44 at time T14. Consequently, the Keene circuit responds to the Test Input Signal and so assumes the corresponding stable state indicating that the Test Input Signal changed state prior to the Reference Input Signal, i.e., the Test Input Signal reached the Keene circuit switch level prior to the Reference Input Signal doing so (T13 occurs before T14). It is, therefore, apparent that by changing the potential level of one input signal relative to the Keene Circuit Switch Level, the response of the Keene circuit can be correspondingly changed.

As it has been observed that adding a bias level to an input signal wave form to the Keene circuit correspondingly increases or decreases the time required for the Keene circuit to respond to a high to low transition occurring on the said signal wave form, the addition of a slowly varying, with respect to the frequency of the input wave forms, bias level to an input signal wave form, results in the time required for the Keene circuit to respond to a high to low transition occurring on said input wave form to correspondingly increase or decrease as the added bias level varies. The addition of a slowly varying, with respect to the frequency of the input wave forms, bias level to one input signal wave form to the Keene circuit results in a corresponding variation in the response of the Keene circuit thereto. Depending upon the time relationship of the high to low transitions between the two input signal wave forms, the output of the Keene circuit changes, as follows.

Figure 5:
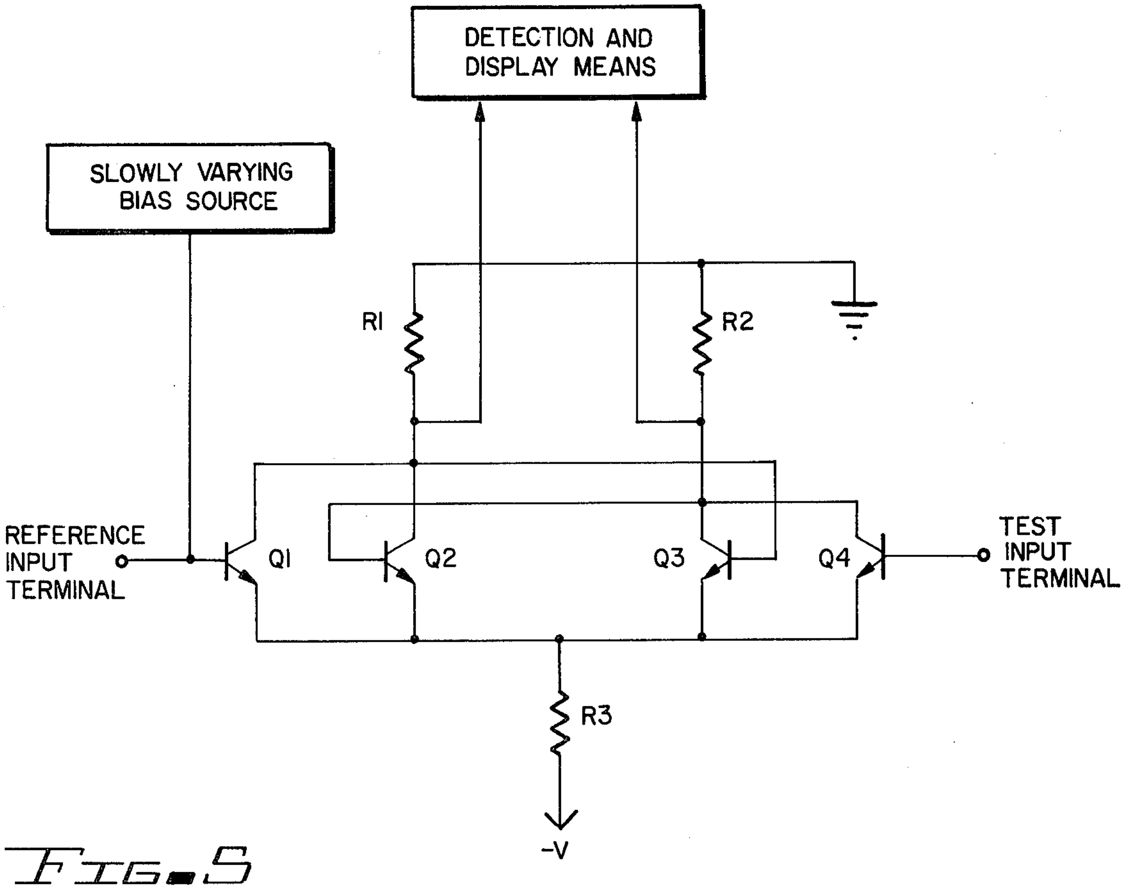
FIG. 5 illustrates the Keene circuit with the addition of a slowly varying bias source.

For the purposes of the following discussion, assume that the slowly varying, with respect to the frequency of the Reference and Test Input Signals, bias level is applied to the Reference Input Terminal, as illustrated in FIG. 5.

Figure 6:
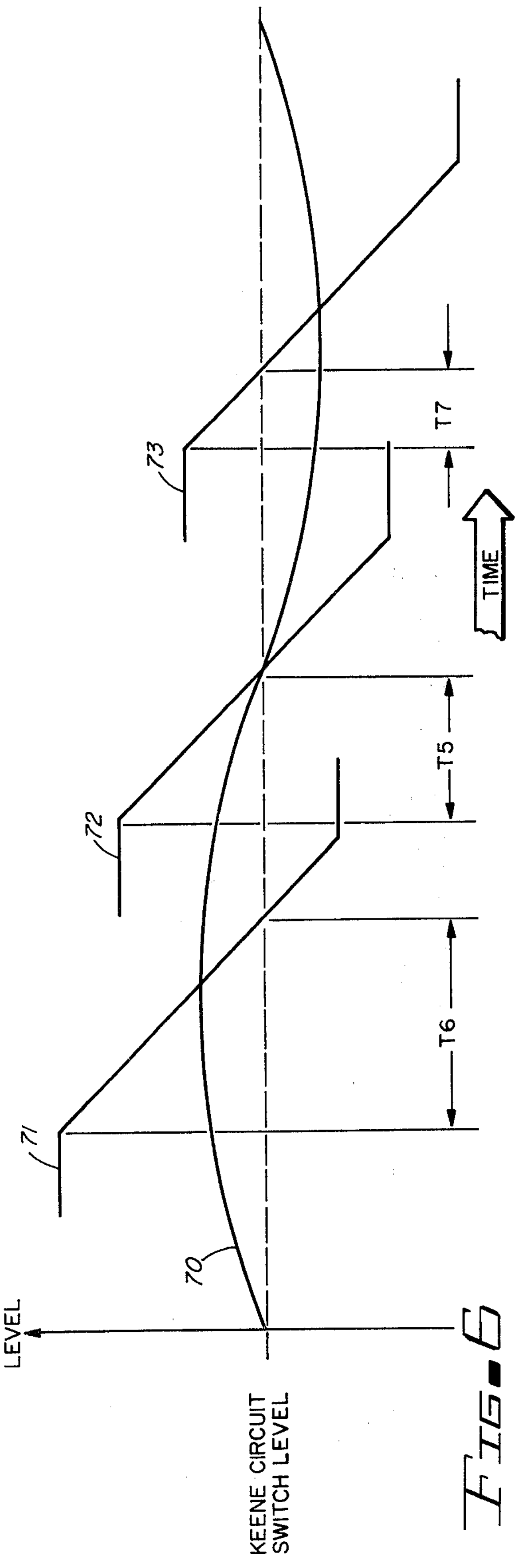
FIG. 6 illustrates a single wave form undergoing a transition from a high to low state to which has been added a slowly varying bias level.

FIG. 6 illustrates a slowly varying, with respect to the frequency of the input signal wave forms, bias level 70, which is added to the Reference Input Signal of the Keene circuit. The said Reference Input Signal is shown undergoing a transition at the time when the slowly varying bias level is at its maximum potential value 71, its zero value 72, and its maximum negative value 73.

Assuming coincidence in time of the high to low transition on the Reference and Test Input Signals, the time required for the Reference Input Signal level to reach the Keene Circuit Switch Level decreases and increases by equal amounts, as illustrated in FIG. 6. T5 represents the time at which the Keene circuit responds to the transition when the slowly varying bias is zero. It is observed that when the slowly varying bias is at its maximum value, the time required for the Reference Input Signal to reach the Keene Circuit Switch Level has increased from T5 to a maximum value of T6, and is dependent upon the maximum level of the slowly varying bias level. This increase in time, for the condition of coincidence in time of the Reference and Test Inputs changing state, results in the Keene circuit responding to the Test Input Signal first. Likewise, when the slowly varying bias level is at its minimum value, the time required for the Reference Input Signal to reach the Keene Circuit Switch Level has decreased from T5 to a minimum time T7 determined by the minimum value of the slowly varying bias level. This decrease in time, for the condition of coincidence in time of the Reference and Test Input Signals changing state, results in the Keene circuit responding to the Reference Input Signal first.

Consequently, when the high to low transition on both the Reference Input Signal and the Test Input Signal are coincident, and a slowly varying bias value is added to the Reference Input Signal, the resulting effect causes the Reference Input Signal to alternately lead and lag the Test Input Signal in time by amounts equal to (T6 minus T5) and (T5 minus T7). For the case when the slowly varying bias value is a symmetrical wave form, the amount of time the Reference Input Signal leads the Test Input Signal equals the amount of time the Reference Input Signal lags the Test Input Signal.

Figure 7:
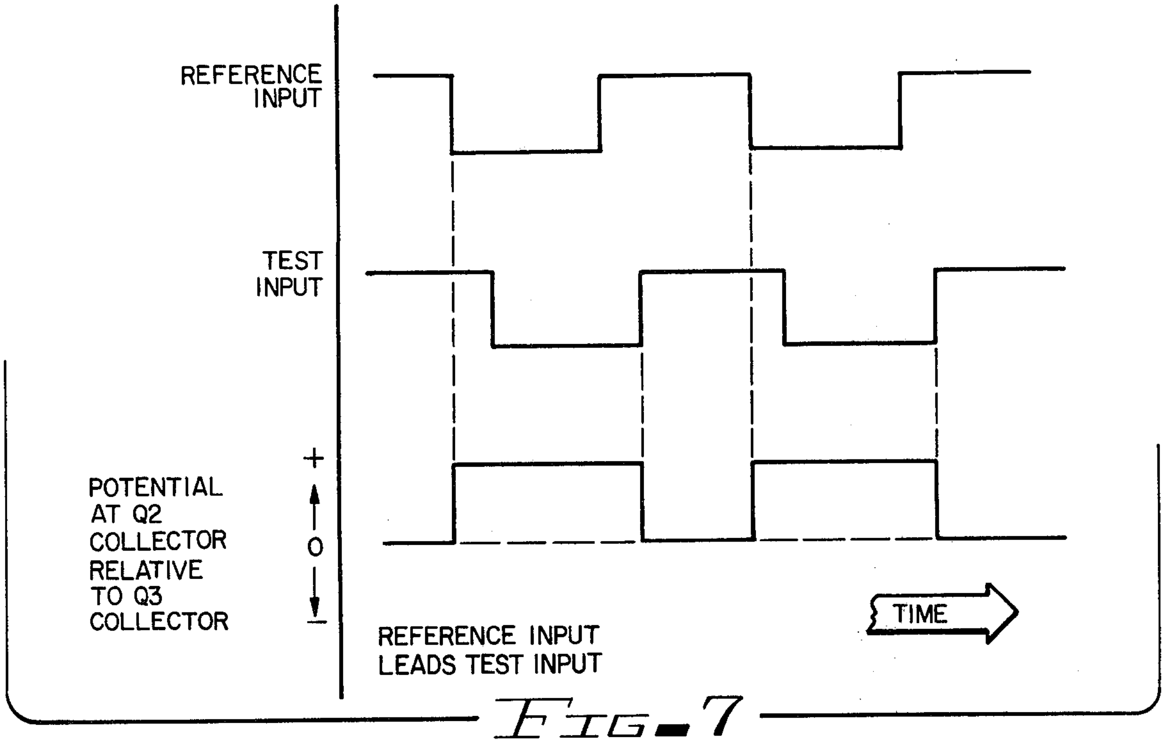
FIG. 7 illustrates the condition wherein the Reference Input Signal to the Keene circuit changes from a high to low state before the Test Input Signal to the Keene circuit does so, and the corresponding differential output of the Keene circuit.

It is recalled from the Keene application that for the case when the Reference Input Signal leads the Test Input Signal, the output of the Keene circuit, viewed differentially across the collector resistors of transistors Q2 and Q3 of FIG. 1, alternates from a zero difference when the Reference Input Signal and Test Input Signal are both in the high state, to a positive value (transistor Q2 collector with respect to transistor Q1 collector) after the Reference Input Signal changes from the high to low state prior to the Test Input Signal doing so. This condition remains until both the Reference Input Signal and Test Input Signal are again in the high state. The differential output of the Keene circuit for this input condition is illustrated in FIG. 7.

Figure 8:
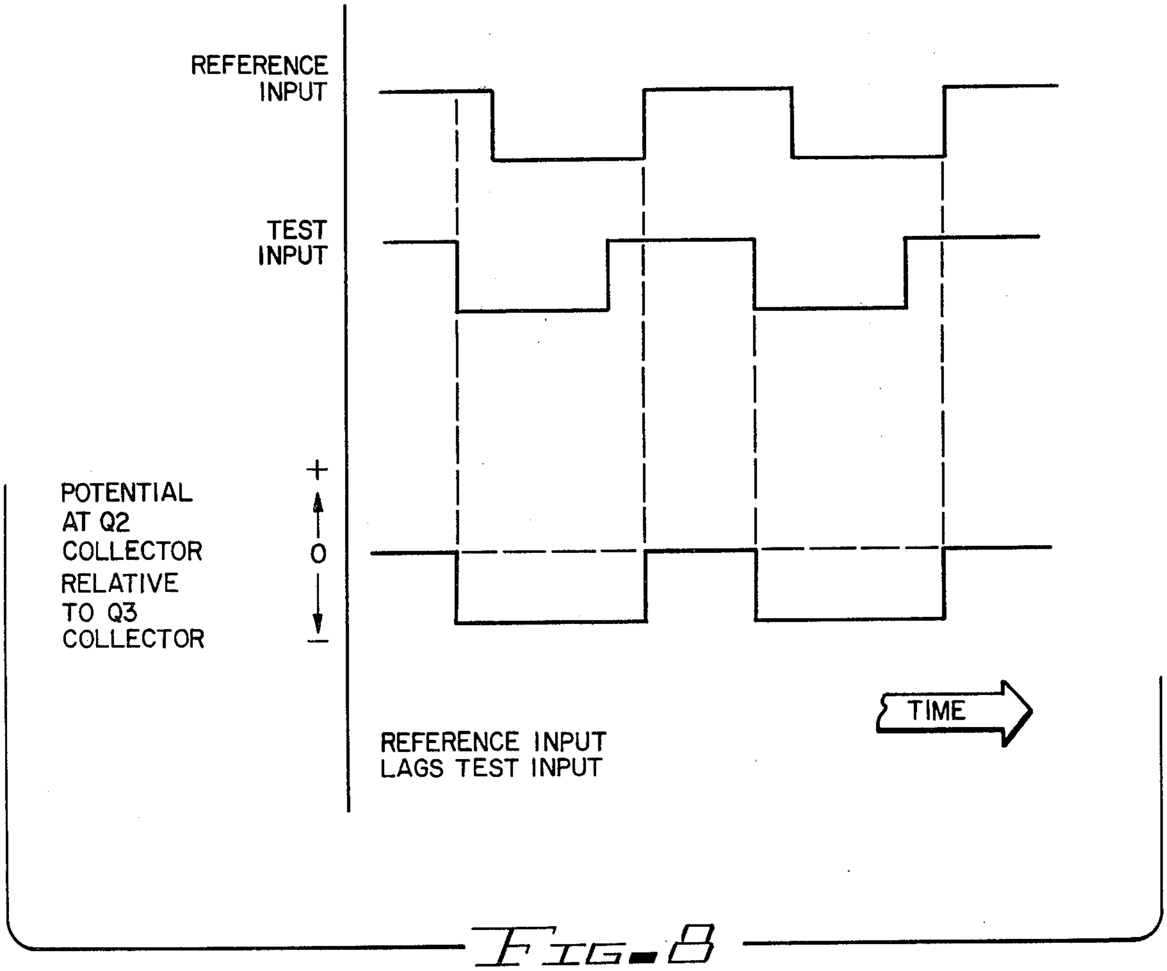
FIG. 8 illustrates the condition wherein the Reference Input Signal to the Keene circuit changes from a high to low state after the Test Input Signal to the Keene circuit does so, and the corresponding differential output from the Keene circuit.

It is also recalled from the Keene application that for the case when the Reference Input Signal lags the Test Input Signal, the output of the Keene circuit, as viewed differentially across the collector resistors of transistor Q2 and transistor Q3 of FIG. 1 alternates from a zero difference when both the Reference Input Signal and the Test Input Signal are both in the high state, to a negative value (transistor Q2 collector with respect to transistor Q1 collector). This condition remains until both the Reference Input Signal and the Test Input Signal again return to the high state. The differential output of the Keene circuit for this input condition is illustrated in FIG. 8.

Figure 9:
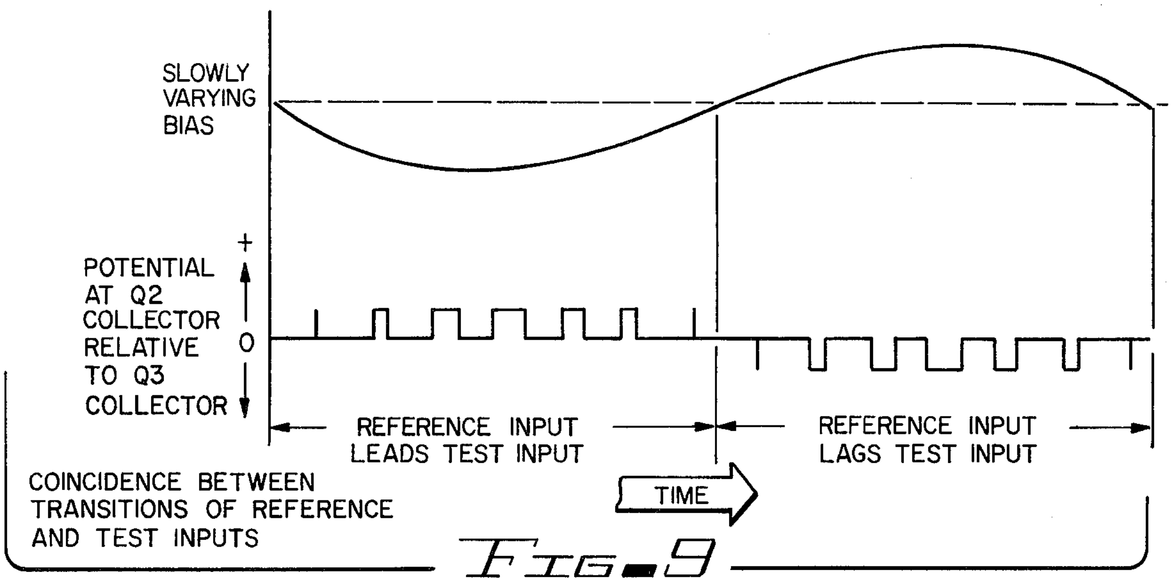
FIG. 9 illustrates a differential output from the Keene circuit for the condition of coincidence between the Test and Reference Input Signals to the Keene circuit with the application of a slowly varying bias level to the Reference Input Signal.

Consequently, it is observed that in a coincident condition with a level added to the Reference Input Signal which varies slowly with respect to the frequency of the wave forms applied to the Keene circuit, the resulting differential wave form appearing across the collectors of transistor Q2 and transistor Q3 of the Keene circuit of FIG. 1 alternates from a zero level to a positive value during the time the Reference Input Signal reaches the Keene circuit switch level prior to the Test Input Signal doing so; and will alternate from a zero value to a negative level during the time the Test Input Signal reaches the Keene circuit switch level prior to the Reference Input Signal doing so. Consequently, in such a coincident condition with a slowly varying bias value added to the Reference Input Signal, the output of the Keene circuit alternates from an average net positive value during the time the Reference Input Signal leads the Test Input Signal to an average net negative value during the time the Reference Input Signal lags the Test Input Signal. For this condition of coincidence with a symmetrical slowly varying bias wave form added to the Reference Input Signal, the average value of the differential voltage at the collector of transistor Q2 with respect to the collector of transistor Q3 over a cycle of the slowly varying bias wave form will be zero. This condition is illustrated in FIG. 9.

For the condition when the Reference Input Signal leads the Test Input Signal, the addition of the slowly varying bias wave form to the Reference Input Signal again changes the time relation of the Reference Input Signal to the Test Input Signal. For the condition when the slowly varying bias wave form is at its zero value, with the Reference Input Signal leading the Test Input Signal, the Reference Input Signal naturally reaches the Keene circuit switch level before the Test Input Signal does so.

As the slowly varying bias wave form begins to decrease in level, the amount of time required for the Reference Input Signal to reach the Keene circuit switch level begins to decrease, as shown in FIG. 6. This only results in the Reference Input Signal reaching the Keene circuit switch level earlier than it previously did when the slowly varying bias was at zero level. Consequently, for negative values of the slowly varying bias, the Reference Input Signal not only continues to lead the Test Input Signal, but leads the Test Input Signal by increasing amounts of time as the slowly varying bias becomes more negative. The net result, however, on the Keene circuit will remain the same, i.e., the Reference Input Signal still leads the Test Input Signal, and consequently the Keene circuit responds in the high to low transition occurring on the Reference Input Terminal. The differential output of the Keene circuit alternates from a zero value to a positive value, as originally shown in FIG. 7, and summarized in FIG. 10, for the time interval T8. It is recalled that for the case of the Reference Input Signal leading the Test Input Signal, the differential output of the Keene circuit changes from the zero level to a positive level when the Reference Input Signal changes from a high to low state. The high output of the Keene circuit remains high until both inputs, i.e., the Reference Input Signal and the Test Input Signal, return to the high state. Consequently, the width of the resulting positive pulse occurring on the differential output of the Keene circuit during time interval T8 changes, reaching a maximum value when the slowly varying bias is at its maximum negative value.

As the slowly varying bias wave form begins to increase in level, the amount of time required for the Reference Input Signal to reach the Keene circuit switch level begins to increase, as shown in FIG. 6. As the slowly varying bias increases to greater positive potentials, the time required for the Reference Input Signal to reach the Keene Circuit Switch Level likewise increases. This process continues to a point at which the time required for the Reference Input Signal to reach the Keene Circuit Switch Level has been so increased that the Test Input Signal reaches the Keene Circuit Switch Level first. At this point, and for positive values of the slowly varying bias greater than this point, the Reference Input Signal has been delayed reaching the Keene Circuit Switch Level until after the Test Input Signal has done so. For this condition, the differential output of the Keene circuit alternates from a zero value to a negative value, as originally shown in FIG. 8, and summarized in FIG. 10, for the time interval T9. In like manner, the width of the negative pulse at the differential output of the Keene circuit changes accordingly.

Figure 10:
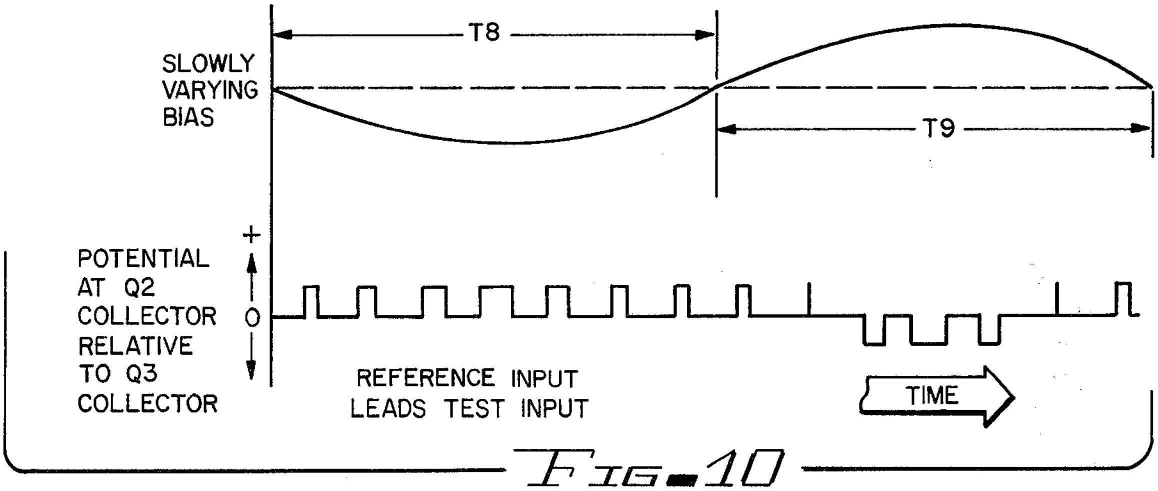
FIG. 10 illustrates the differential output of the Keene circuit for the condition when the Reference Input Signal leads the Test Input Signal in making a high to low transition, with the application of a slowly varying bias level to the Reference Input Signal.

It should be particularly observed in connection with the condition when the Reference Input Signal leads the Test Input Signal as shown in FIG. 10, that the differential voltage appearing at transistor Q2 collector with respect to transistor Q3 collector has a net positive value over a cycle of the slowly varying bias level; in particular, the greater the relative time difference between the occurrence of the high to low transition on the Reference Input Signal before the same on the Test Input Signal, the greater the net positive value (over a cycle of the slowly varying bias wave form). In particular, the average potential value is directly proportional to said time difference.

For the condition when the Reference Input Signal lags the Test Input Signal, the addition of the slowly varying bias to the Reference Input Signal again changes the time relation of the Reference Input Signal to the Test Input Signal. For the condition when the slowly varying bias wave form is at its zero value, with the Reference Input Signal lagging the Test Input Signal, the Test Input Signal naturally reaches the Keene Circuit Switch Level before the Test Input Signal does so.

Figure 11:
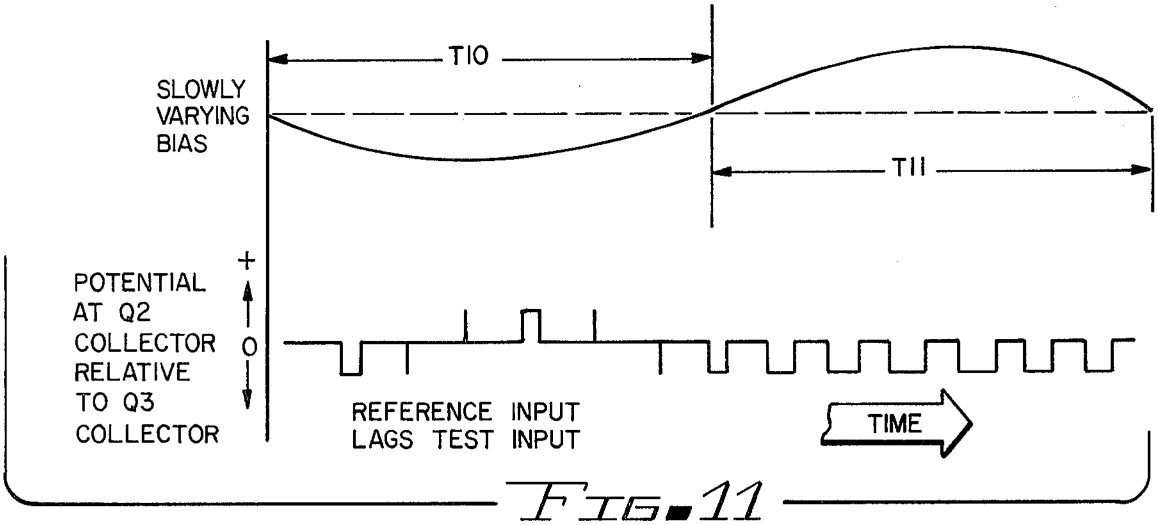
FIG. 11 illustrates the differential output of the Keene circuit for the condition when the Reference Input Signal lags the Test Input Signal in making a high to low transition, with the application of a slowly varying bias level to the Reference Input Signal.

As the slowly varying bias wave form begins to decrease in level, the amount of time required for the Reference Input Signal to reach the Keene Circuit Switch Level begins to decrease, as shown in FIG. 6. As the slowly varying bias decreases to greater negative levels, the time required for the Reference Input Signal to reach the Keene Circuit Switch Level likewise decreases. This process continues to a point at which the time required for the Reference Input Signal to reach the Keene Circuit Switch Level has been so decreased that the Reference Input Signal will reach the Keene Circuit Switch Level first (it no longer lags the Test Input Signal). At this point, and for negative values of the slowly varying potential more negative than this point, the Reference Input Signal has been advanced in reaching the Keene Circuit Switch Level before the Test Input Signal. For this condition, the differential output of the Keene circuit alternates from a zero value to a positive value, as originally shown in FIG. 7, and summarized in FIG. 11 for the time interval T10.

As the slowly varying bias begins to increase in level, the amount of time required for the Reference Input Signal to reach the Keene Circuit Switch Level begins to increase, as shown in FIG. 6. This only results in the Reference Input Signal reaching the Keene Circuit Switch Level even later than it previously did when the slowly varying potential was at zero potential. Consequently, for positive values of the slowly varying bias, the Test Input Signal will not only continue to lead the Reference Input Signal, but leads the Reference Input Signal by increasing amounts of time, as the slowly varying bias becomes more positive. The net result, however, on the Keene circuit remains the same, i.e., the Test Input Signal still leads the Reference Input Signal, and consequently the Keene circuit so responds to the high to low transition on the Test Input Signal. The differential output of the Keene circuit alternates from a zero value to a negative value, as originally shown in FIG. 8, and summarized in FIG. 11, for the time interval T11.

It is again observed that the width of the pulses appearing at the differential output of the Keene circuit vary, as the amount of time difference between the transitions occurring on the inputs continues to vary in response to the slowly varying bias, as previously discussed. It should be particularly observed in connection with the condition when the Reference Input Signal lags the Test Input Signal that the differential voltage appearing at the collector of transistor Q2 with respect to the collector of transistor Q3 has a net negative value over a cycle of the slowly varying potential; in particular, the greater the relative time difference between the occurrence of the high to low transition on the Test Input Signal before the same on the Reference Input Signal, the greater the negative potential value (over a cycle of the slowly varying bias wave form). In particular, the average negative potential value is directly proportional to said time difference.

Consequently, by observing and measuring the average differential potential across the collectors of transistors Q2 and Q3 of the Keene circuit over a cycle of the slowly varying bias wave form, it is possible to determine significant information pertaining to the time relationship between the high to low transitions on two wave forms. As has been previously discussed, the average value of the level of transistor Q2 collector relative to transistor Q3 collector, over a cycle of the slowly varying bias level, is directly proportional to the time difference between the occurrence of transitions on the Reference and Test Input Signals. It follows, therefore, that by providing a Reference Input Signal and a Test Input Signal with a known time difference between transitions in state, the output of the present invention can easily be calibrated, by techniques well known to one skilled in the relevant art. Consequently, the present invention can indicate not only which of two wave forms is undergoing a transition first, but also the amount of time between transitions. The above results are, by the present invention, simply and inexpensively obtained.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. Apparatus for determining the relative order of occurrence of transitions in signal level state in a first and a second wave form signal; and for determining time difference therebetween, said apparatus comprising:

a pair of transistor means cross-coupled to provide a bistable transistor unit;

a third transistor connected to selectively provide a short-circuit path across one transistor of said pair;

said third and fourth transistors each having a control electrode to control the respective short-circuit paths;

means coupling said first input wave form signal to said control electrode of said third transistor and means coupling said second input wave form signal to said control electrode of said fourth transistor to control the selective actuation of said respective short-circuit paths, said short circuit paths, when actuated, inhibiting the bistable actuation of said bistable transistor unit;

said bistable transistor unit being triggered to one or the other of its bistable states depending upon which of said input wave form signals first undergoes a transition to block said short-circuit path associated therewith, such triggering occurring on each cyclic transition of said wave form signals;

bias signal means providing a bias signal, said bias signal being symmetrical about a zero value and varying slowly with respect to said first and second input wave form signal;

means coupling said bias signal means to superimpose said bias signal on said first input wave form signal at said control electrode of said third transistor time shifting the triggering base level of said third transistor in accordance with the instantaneous level of said bias signal thereby producing positive output signals during one part of said symmetrical bias signal and negative output signals during the remainder of said symmetrical bias signal; and means connected to said bistable transistor unit to detect the ratio of said positive and negative signals as a function of the order of occurrence of said transitions in said first and second wave form signals and the time difference therebetween.

2. Apparatus as set forth in claim 1 wherein said bias signal is a slowly varying sine-wave signal.

3. Apparatus as set forth in claim 1 wherein said input signals have a cyclic rate which is an order of magnitude higher than said bias signal whereby said bistable transistor unit is triggered a plurality of times during each cycle of said bias signal.

4. Apparatus for determining the relative order of occurrence of a transition from a first to a second state between a first and a second input wave form signal, and for determining the time difference therebetween, said apparatus comprising:

a first switching transistor means having base, emitter and collector electrodes;

a second switching transistor means having base, emitter and collector electrodes;

means connecting said collector of said first transistor means to said base electrode of said second transistor means and means connecting said collector of said second transistor means to said base electrode of said first transistor means;

a third and a fourth transistor means, each having base, emitter and collector electrodes;

means connecting said collector of said third transistor means to said collector of said first transistor means and, through a first load resistor, to a first common point of fixed reference potential;

means connecting said collector of said fourth transistor means to said collector of said second transistor means and, through a second load resistor, to said first common point;

means connecting said emitters of said first, second, third and fourth transistor means together and, through a common emitter resistor to a second common point of reference potential;

said first and second transistor means comprising a bistable transistor unit;

means coupling said first input wave form signal to said base electrode of said third transistor means to control the conductivity of said third transistor means in accordance with the signal level of said first input signal and means coupling said second input wave form signal to said base electrode of said fourth transistor means to control the conductivity of said fourth transistor in accordance with the signal level of said second input signal, said bistable unit being inhibited when both said third and fourth transistor means are conductive, said bistable unit being triggered to one or the other of its bistable states to produce relatively positive or relatively negative signals depending upon which of said two input signals first undergoes a transition in signal level;

bias signal means for providing a bias signal, said bias signal being symmetrical about a zero value and varying slowly with respect to said first and second input wave form signals;

means coupling said bias signal means to said base electrode of said third transistor to superimpose said bias signal on said first input wave form signal, time shifting the triggering base level of said third transistor in accordance with the instantaneous level of said bias signal thereby producing positive output signals during one part of said symmetrical bias signal and negative output signals during the remainder of said symmetrical bias signal; and means connected to said bistable transistor unit to detect the ratio of said positive to negative output signals as a function of the order of occurrence said transitions in said first and second input signals and the time difference therebetween.

* * * * *